(12) United States Patent
Nyström et al.

(10) Patent No.: US 6,728,319 B1
(45) Date of Patent: Apr. 27, 2004

(54) DECODING METHOD AND APPARATUS

(75) Inventors: Per Johan Anders Nyström, Stockholm (SE); Björn Stig Erik Johansson, Kungsängen (SE); Tomas Gunde Svensson, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/582,300

(22) PCT Filed: Dec. 17, 1998

(86) PCT No.: PCT/SE98/02344

§ 371 (c)(1),
(2), (4) Date: Jun. 22, 2000

(87) PCT Pub. No.: WO99/33187

PCT Pub. Date: Jul. 1, 1999

(30) Foreign Application Priority Data

Dec. 22, 1997 (SE) .............................................. 9704830

(51) Int. Cl.$^7$ ......................... H04B 14/04; H03M 13/00
(52) U.S. Cl. ....................... 375/243; 375/245; 375/262; 375/265; 375/240.22; 714/780; 714/795
(58) Field of Search ................................ 375/254, 316, 375/340, 240.27, 240.22, 245, 262, 265, 224, 240.03; 704/222; 714/780, 785, 795

(56) References Cited

U.S. PATENT DOCUMENTS

| | | | | |
|---|---|---|---|---|
| 4,864,397 | A | * 9/1989 | Zehner et al. | .......... 375/240.14 |
| 5,524,170 | A | 6/1996 | Matsuo et al. | .............. 395/2.31 |
| 5,684,832 | A | * 11/1997 | Adachi et al. | ............... 375/262 |
| 5,765,127 | A | 6/1998 | Nishiguchi et al. | ......... 704/208 |
| 5,933,806 | A | * 8/1999 | Beyerlein et al. | ........... 704/256 |
| 6,581,179 | B1 | * 6/2003 | Hassan | ....................... 714/776 |

FOREIGN PATENT DOCUMENTS

JP    JP8-147000    9/1996

OTHER PUBLICATIONS

Alajaji et al, Soft–Decision COVQ for Rayleigh–Fading Channels, IEEE Communications Letters, vol. 6, Jun. 1998.*
Gjervaldsaeter, P.; International Search Report; App. No. PCT/SE98/02344; Jun. 3, 1999, pp. 1–3.
Skoglund, M., et al.; *Vector Quantization Over a Noisy Channel Using Soft Decision Decoding*; pp. V605—V608, ICASSP '94, vol. 5, Apr. 1994.
Xiao, H., et al.; *Channel Optimized Vector Quantization with Soft Input Decoding*; pp. 501–504, ISSPA '96, vol. 2, Aug. 25–30, 1996.
Varvardin, N.; *A Study of Vector Quantization for Noisy Channels*; IEEE Transactions on Information Theory, vol. 36, No. 4, Jul. 1990, pp. 799–808.
Varvardin, N.; *On the Performance and Complexity of Channel–Optimized Vector Quantizers*; IEEE Transactions on Information Theory, vol. 37, No. 1, Jan. 1994, pp. 155–160.
Hedelin, P., et al.; Chapter 10, *Theory for Transmission of Vector Quantization Data*; "Speech Coding and Synthesis," 1995 Elsevier Science B.V., pp. 1–55.

* cited by examiner

*Primary Examiner*—Jean B. Corrielus
*Assistant Examiner*—Qutbuddin Ghulamali

(57) ABSTRACT

A decoder in a communication system using channel optimized vector quantization and including an encoder stores active encoder centroids $c_i$ corresponding to active indices i, an active index being defined as an index that has a predetermined source probability $p_i > 0$ of being selected by the encoder for transmission to the decoder, source probabilities $p_i$ and the bit error rate epsilon to dynamically estimate a decoded vector using a sub-optimal algorithm in which only the most significant contributions are considered.

22 Claims, 7 Drawing Sheets

* = NEVER USED BY ENCODER SIDE (INACTIVE)

DECODING METHOD AND APPARATUS

CROSS-REFERENCE TO RELATED APPLICATIONS

This application is a national filing under 35 U.S.C. § 371 of International Application No. PCT/SE98/02344 filed Dec. 17, 1998, which claims priority on Swedish Patent Application 9704830-0 filed Dec. 22, 1997.

TECHNICAL FIELD

The present invention relates to a decoding method and apparatus in a communication system using channel optimized vector quantization.

BACKGROUND OF THE INVENTION

Vector quantization (VQ) is a data encoding method in which a sample vector consisting of several samples is approximated by the "nearest" vector of a collection of vectors called a code book. Instead of representing the sample vector by its components, it is represented by the code book index of this "nearest" code book vector. This index is transmitted to a decoder, which uses the index to retrieve the corresponding code book vector from a copy of the code book. Vector quantization is used in, for example, speech coding in mobile telephony. A drawback of this method is that the transmitted index may, due to the influence of the transmission channel, not always be the same as the received index. In these cases, the actually decoded vector may differ significantly from the original sample vector.

An often used approach to reduce the sensitivity to channel errors is to apply forward error correction coding (FEC). In this way the decoder may detect and even correct errors that occurred during transmission before code book lookup. However, a drawback of this method is that redundancy has to be introduced in the code words that are transmitted over the channel. Furthermore, this method requires very long codes in order to give an acceptable error rate performance. A common way to obtain such long code words is to collect indices from several vector quantized sample vectors before the FEC coding is performed. This collecting process results in a substantial delay, which is in general undesirable in real time applications, such as mobile telephony or video and audio transmission.

An alternative approach to error protection is channel optimized vector quantization (COVQ), see ref. [1,2]. Instead of protecting the transmitted index against channel errors COVQ takes into account the statistical properties of the channel already in the code book construction. The idea behind COVQ is that although the wrong code book index may have been received, the decoded code book vector should still be "close" to the original sample vector. A characteristic feature of COVQ is that the number of indices that may be transmitted is actually smaller than the number of indices that may be received. In this way, the code book may contain vectors "in between" code book vectors corresponding to actually transmitted indices. A channel error may therefore still result in a decoded vector that is "close" to the intended vector. Thus, COVQ offers a jointly optimized vector quantization and channel protection system. Since long code words are not required, the extra delay introduced by FEC coding may be avoided. A characteristic feature of conventional COVQ is that it has very large storage requirements, since the number of code book vectors is very large. There already exist methods to reduce these storage requirements on the encoder side down to the same as for normal VQ, see [3].

On the decoder side there has been suggested 141 an algorithm for soft decoding of received signals. However, this algorithm is computationally intense.

SUMMARY OF THE INVENTION

An object of the present invention is to provide a COVQ decoding method and apparatus in which the storage and computational requirements in the decoder are significantly reduced.

This object is achieved by a method and apparatus in accordance with the enclosed patent claims.

Briefly, the present invention achieves the above object by storing centroid vectors that correspond to active indices (indices that may actually be sent) in the decoder, and calculating the resulting decoder output vector from these vectors, stored source probabilities, a transmission channel quality measure and an actually received index. As will be shown below, this significantly reduces the storage requirements.

Furthermore, the computational complexity is reduced by including only the most significant contributions in the calculations.

BRIEF DESCRIPTION OF THE DRAWINGS

The invention, together with further objects and advantages thereof, may best be understood by making reference to the following description taken together with the accompanying drawings, in which.

DETAILED DESCRIPTION OF THE PREFERRED EMBODIMENTS

In the following description, the same reference designations are used for elements with the same or similar functions.

Before the invention is described in detail, a short summary of channel protected vector quantization and channel optimized vector quantization will be given with reference to FIGS. 1–3.

Figure 1:
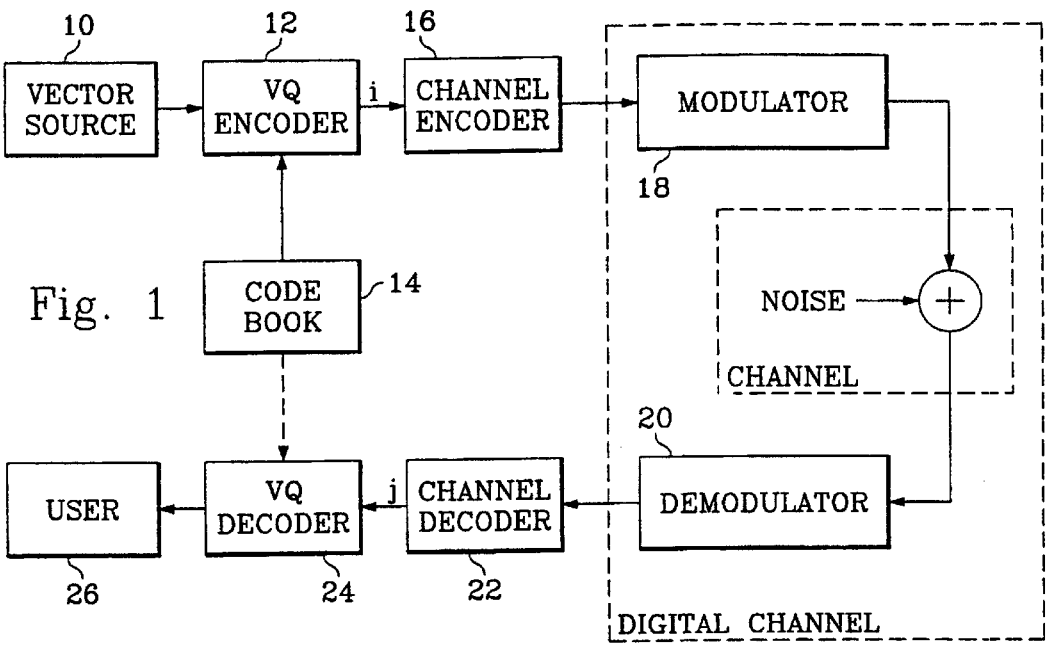
FIG. 1 is a block diagram of a channel protected vector quantization system.

FIG. 1 is a block diagram illustrating the principles of a channel protected vector quantized communication system.

A vector source 10 outputs sample vectors to a VQ encoder 12. VQ encoder 12 searches a code book 14 containing a collection of code book vectors to find the "closest" match. The index i of this code book vector is forwarded to a channel encoder 16 that provides this index with error protection. The protected index is forwarded to a modulator 18 and transmitted over a noisy channel. The received signal is demodulated in a demodulator 20. As indicated modulator 18, demodulator 20 and the noisy channel together form a digital channel. The demodulated signal is channel decoded in a channel decoder 22, and a received index j is forwarded to a VQ decoder 24. VQ decoder 24 is a simple lookup table that retrieves a code vector corresponding to index j from a copy of code book 14. The fact that the same code book is used in encoder and decoder has been indicated by the dashed line from code book 14 to decoder 24. Finally the retrieved code book vector is forwarded to a user 26.

Figure 2:
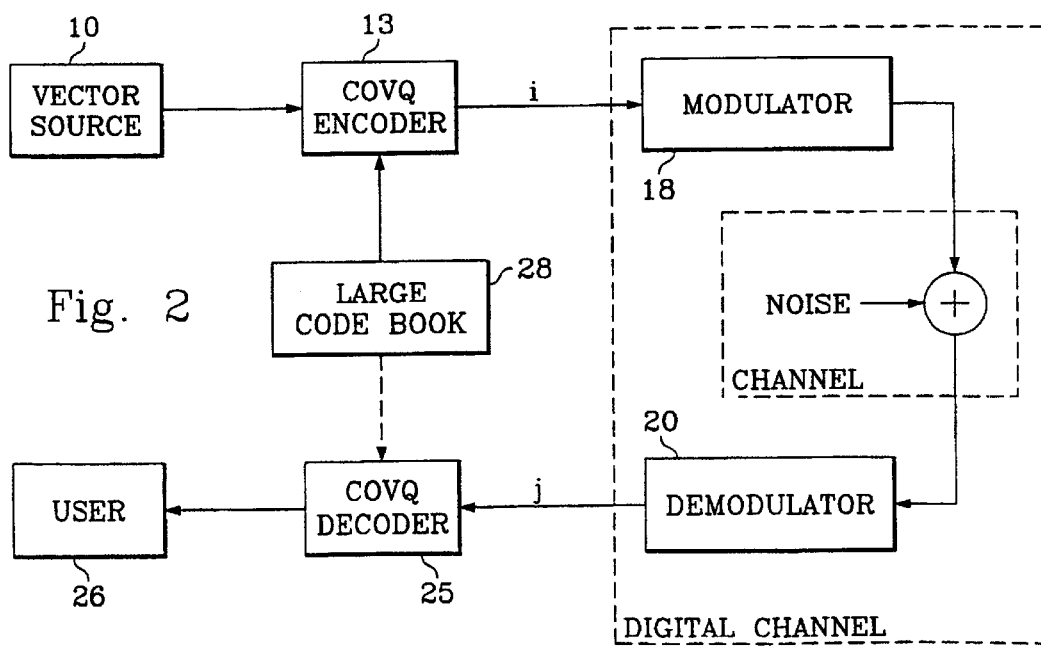
FIG. 2 is a block diagram of a channel optimized vector quantization system.

FIG. 2 is a block diagram illustrating the principles of a channel optimized vector quantized communication system. A vector source 10 outputs sample vectors to a COVQ encoder 13. COVQ encoder 13 uses a code book 28 containing a collection of code book vectors to find the "closest" match. An index i characterizing the quantized sample vector is forwarded to a modulator 18 and transmitted over a noisy channel. The received signal is demodulated in a demodulator 20. The received and demodulated index j is forwarded to a COVQ decoder 25. COVQ decoder 25 is a simple lookup table that retrieves a code vector corresponding to index j from a code book 28. Finally the retrieved code book vector is forwarded to a user 26.

It is to be noted that in the case of COVQ in accordance with FIG. 2, code book 28 is, in general, very large. As indicated in FIG. 3 code book 28 comprises a collection of M code book vectors $\hat{c}_0, \hat{c}_1, \ldots, \hat{c}_{M-1}$. Principles for determining this code book are described in ref. [1,2]. As has been indicated in FIG. 3 not all vectors in the code book are active, i. e. not every vector has a source probability $p_i > 0$ of being assigned to a given source vector x. The vectors that will never be assigned have been marked by "★" in FIG. 3. Thus, vectors with indices 1, 2, 3 and M-2 are inactive in FIG. 3. This means that these indices will never be transmitted to the decoder regardless of which source vector x that is encoded. The set of active vectors depends on the channel quality and is determined during a training procedure as explained in [1,2].

Figure 3:
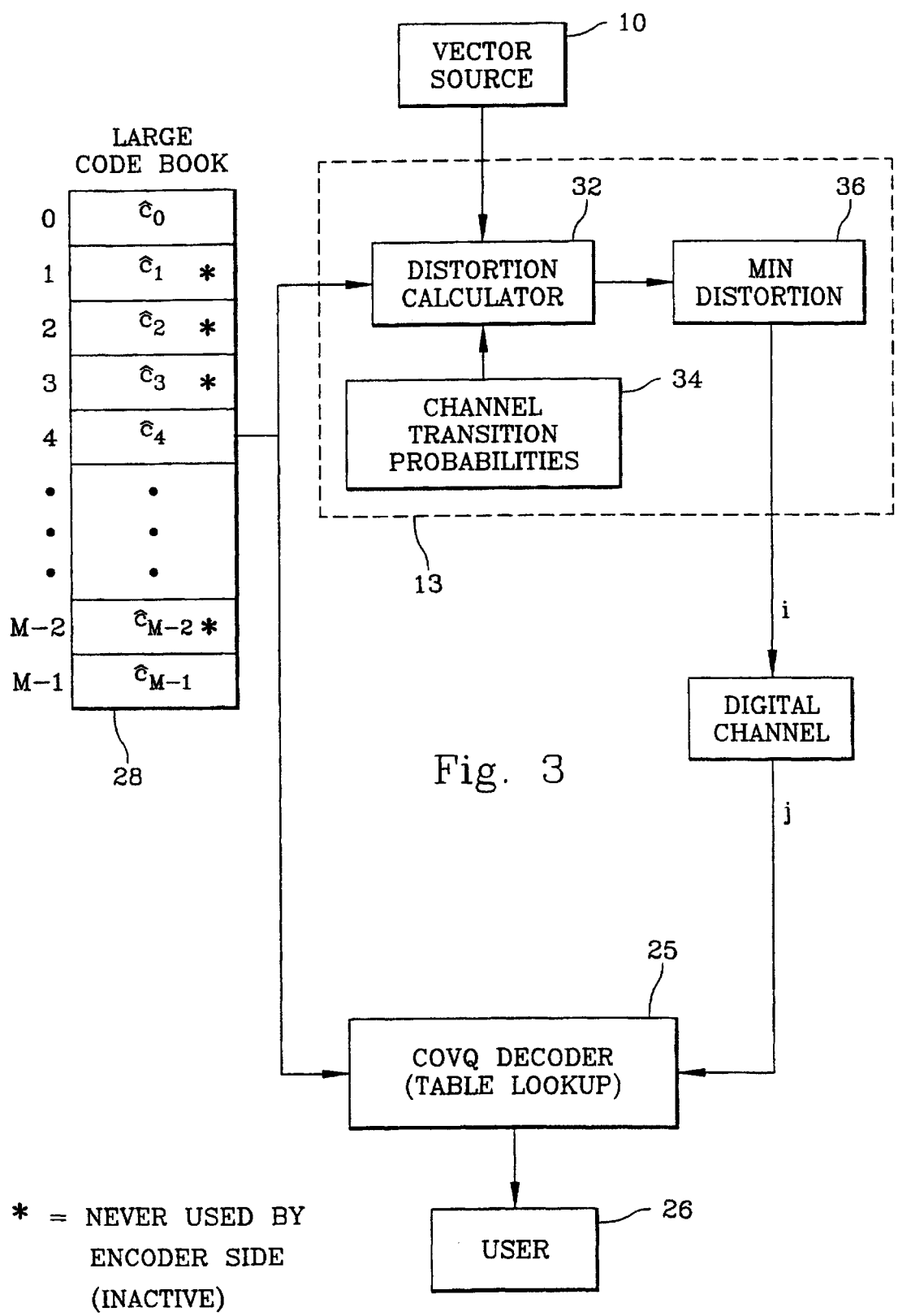
FIG. 3 is a more detailed block diagram of a channel optimized vector quantization system.

FIG. 3 illustrates the "matching" process in the COVQ encoder in more detail. A distortion calculator 32 typically calculates (see [1]) a collection of distortion measures $\alpha i(x)$ according to $$\alpha_i(x) = E[\|x - \hat{c}_J\|^2 \mid I = i] = \sum_{j=0}^{M-1} \|x - \hat{c}_j\|^2 p_{j|i}$$

where E[.] denotes expected value, $\|\cdot\|^2$ denotes the squared euclidean distance, J,I are stochastic variables, M is the number of vectors in the code book and $p_{j|i}$ is the conditional channel transition probability, obtained from block 34, that code book index j was received when index i was actually sent over the channel (the expression j|i denotes "j given i"). For a binary symmetric channel the conditional channel transition probabilities $p_{j|i}$ may be calculated as $$p_{j|i} = \epsilon^{d_H(j,i)}(1-\epsilon)^{N-d_H(j,i)}$$

where N denotes the number of bit positions in an index, $d_H(j,i)$ denotes the Hamming distance (the number of differing bits) between j and i, and $\epsilon$ denotes the bit error rate (BER) of the channel.

The quantity $\alpha i(x)$ represents the expected decoding error or distortion of a sample vector x that has been vector quantized (encoded) to index i. In COVQ the index i giving the smallest distortion $\alpha i(x)$ for a given sample vector x is selected as the encoding index. Block 36 finds the index i of the distortion measure in the collection that has the smallest value. This is the index that will be transmitted.

The decoding in a conventional COVQ decoder is simple. As illustrated in FIG. 3 it consists of a simple lookup in block 25 of the decoder code book vector $\hat{c}_j$ that corresponds to the received index j. However, as noted above this simple decoding scheme requires a lot of storage space for the large COVQ code book. As an example, encoding of LSF (Line Spectral Frequency) parameters involves quantization of 3-element floating point vectors. A typical COVQ code book size for this example is $M=2^{18}=262\,144$ vectors.

Figure 4:
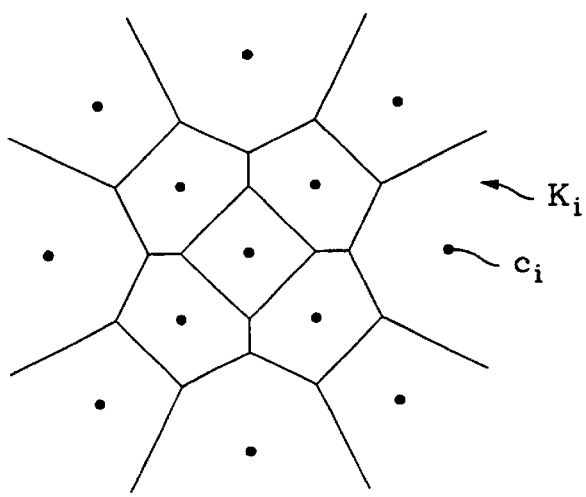
FIG. 4 is a two-dimensional Voronoi-diagram illustrating the concept of active encoder centroids.

The idea behind the present invention is that it is not necessary to store the entire COVQ code book to obtain the decoded vector. Another possibility is to dynamically calculate or estimate this vector instead. As a starting point for this calculation, it may be shown that (see [3])

$$\hat{c}_j = E[X \mid J = j] = E[c_I \mid J = j] = \sum_{i=0}^{M-1} c_i \cdot q_{i|j}$$

where $q_{i|j}$ denotes the conditional channel transition probability that an index i has been sent, given that an index j has been received. Furthermore, $c_i$ are the active encoder centroids of the encoding or Voronoi-regions that are defined by (see [1, 2])

$$K_i = \{x; \alpha_i(x) \leq \alpha_j(x), j=0,1,\ldots,M-1\}$$

or expressed in words, $c_i$ are the vectors to the "center of mass" of regions $K_i$, where each region $K_i$ encloses the tips of all the source vectors x that will be assigned to index i. FIG. 4 illustrates this for two-dimensional vectors x. The solid lines in FIG. 4 represent the borders between the different encoding regions $K_i$, while the dots represent the centroids $c_i$. Since inactive indices will have no encoding regions, it is appreciated that there are only $M_a$ active encoder centroids $c_i$.

The probabilities $q_{i|j}$ may be calculated from the probabilities $p_{j|i}$ and $p_i$ by using Bayes theorem. Thus, $q_{i|j}$ may be expressed as $$q_{i|j} = \frac{p_{j|i} \cdot p_i}{\sum_{i=0}^{M-1} p_{j|i} \cdot p_i}$$

This gives the following expression for the code book vector $$\hat{c}_j = \frac{\sum_{i=0}^{M-1} c_i \cdot p_{j|i} \cdot p_i}{\sum_{i=0}^{M-1} p_{j|i} \cdot p_i}$$

However, as noted before there are only $M_a$ active encoder centroids $c_i$. This means that the summation only has to be performed over active indices i. Thus, the decoder code book vector may be expressed as $$\hat{c}_j = \frac{\sum_{\substack{active \\ indices \\ i}} c_i \cdot p_{j|i} \cdot p_i}{\sum_{\substack{active \\ indices \\ i}} p_{j|i} \cdot p_i}$$

From this formula it is clear that what is actually needed at the decoder to calculate $\hat{c}_j$ is a set of $M_a$ active encoder centroids $c_i$, a corresponding set of source probabilities $p_i$ and the channel transition probabilities $p_{j|i}$. However, as noted above, the bit error rate $\epsilon$ may be used to calculate the probabilities $p_{j|i}$ in accordance with $$p_{j|i} = \epsilon^{d_H(j,i)}(1-\epsilon)^{N-d_H(j,i)}$$

Returning once again to the above mentioned encoding of LSF parameters, the COVQ code book was assumed to consist of $M=2^{18}=262\ 144$ vectors. If a bit error rate of 10% is assumed, the training process will typically result in $M_a \approx 500$ active encoder centroids $c_i$, which is a significant reduction in storage requirements.

Figure 5:
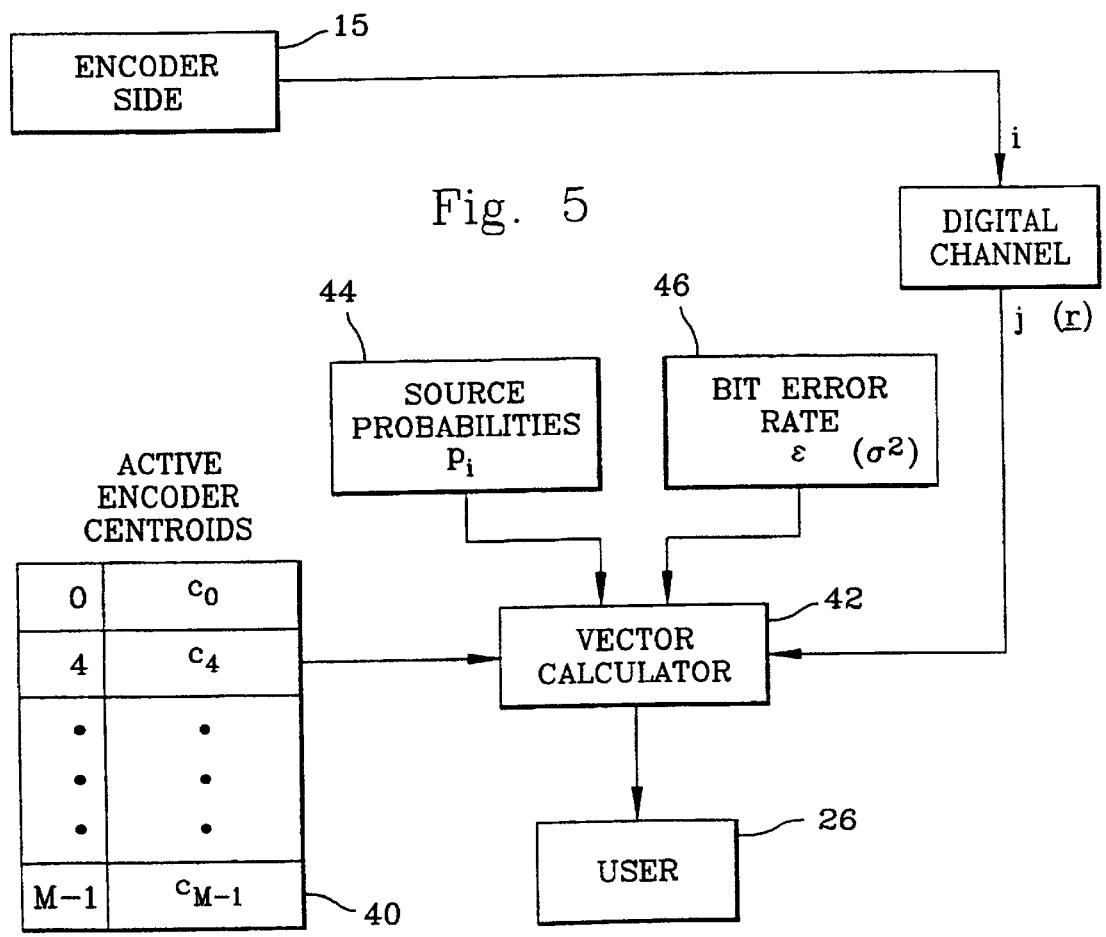
FIG. 5 is a block diagram of an embodiment of a channel optimized vector quantization system in accordance with the present invention.

FIG. 5 is a block diagram of an embodiment of a channel optimized vector quantization system in accordance with the present invention. Since only the active indices are used by the decoder, it is sufficient to store only a collection 40 of active encoder centroids $c_i$. This collection 40 will contain only the active centroid vectors and their corresponding indices. A vector calculator 42 calculates the code book vector $\hat{c}_j$ that corresponds to a received index j by using collection 40, the stored (in block 44) source probabilities $p_i$ and the stored (in block 46) bit error rate $\epsilon$. In a typical embodiment vector calculator 42 is implemented by a micro processor or a micro/signal processor combination.

Figure 6:
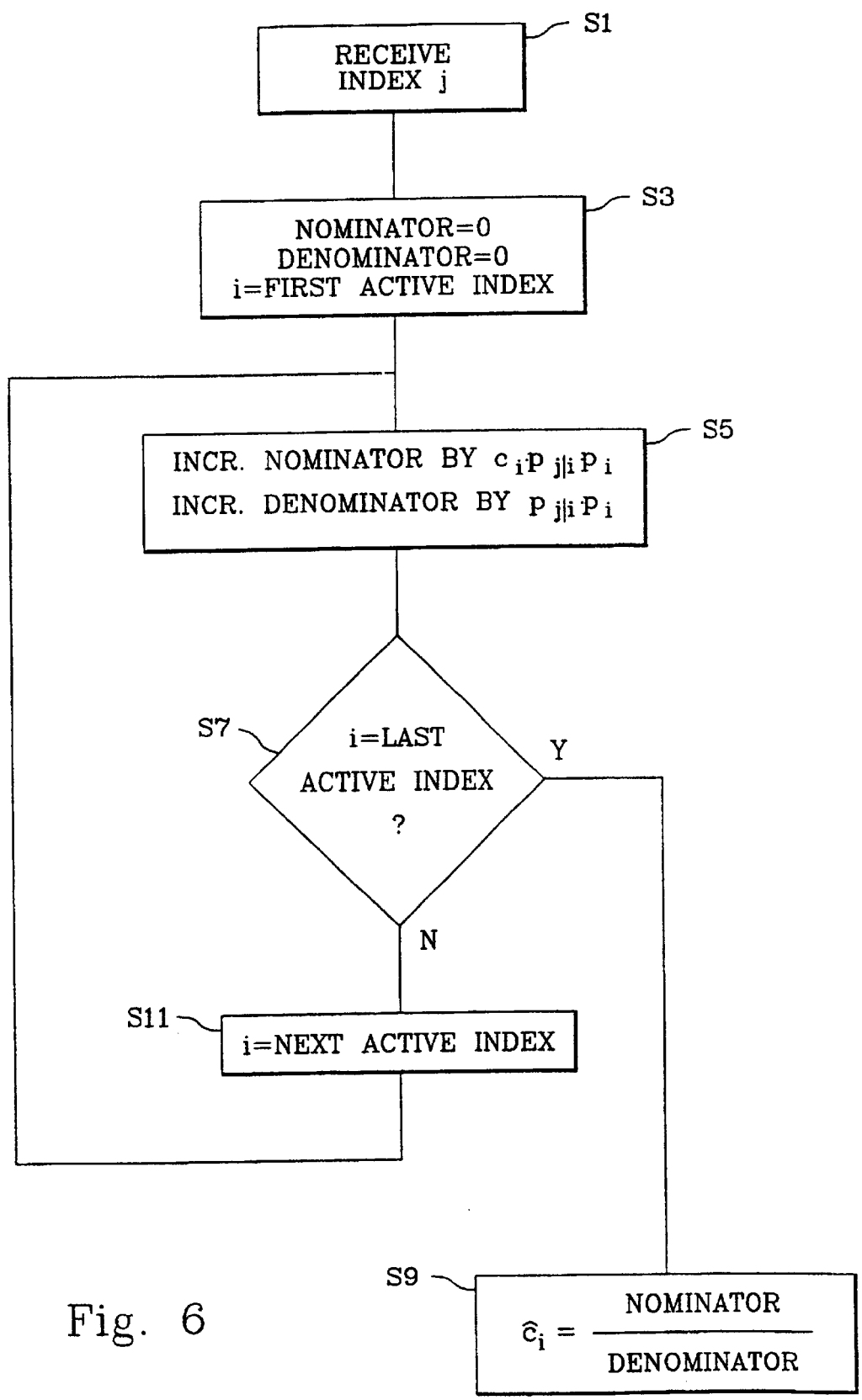
FIG. 6 is a flow chart illustrating an embodiment of a decoding method on which the present invention is based.

A flow chart illustrating the basic method is given in FIG. 6. In step S1 an index j is received from the encoder. Step S3 sets the numerator and denumerator in the above expression for $\hat{c}_j$ to 0. Furthermore, step S3 initializes i to the first active index. In step S5 the numerator is incremented by $c_j \cdot p_{j|i} \cdot p_i$ and the denumerator is incremented by $p_{j|i} \cdot p_i$. Step S7 tests whether the current index i is the last active index. If this is the case, the result vector $\hat{c}_j$ is formed by dividing the numerator by the denumerator in step S9. Otherwise, index i is updated to the next active index in step S11.

In the above discussion it has been assumed that all $M_a$ source probabilities $p_i > 0$ are used in the summation. However, the complexity can be reduced by accepting a sub-optimal estimate of $\hat{c}_j$, in which the number of terms in the summation has been reduced.

One such sub-optimal approach to calculate an approximation to $\hat{c}_j$ is to include only the most significant terms, that is terms for which $p_i > \delta$, where $\delta$ is a small positive number, for example $0.01/M_a$. In this case, an estimate of $\hat{c}_j$ may be expressed as $$\hat{c}_j \approx \frac{\sum_{\substack{active \\ indices \\ i\ for\ which \\ p_i > \delta}} c_i \cdot p_{j|i} \cdot p_i}{\sum_{\substack{active \\ indices \\ i\ for\ which \\ p_i > \delta}} p_{j|i} \cdot p_i}$$

Figure 7:
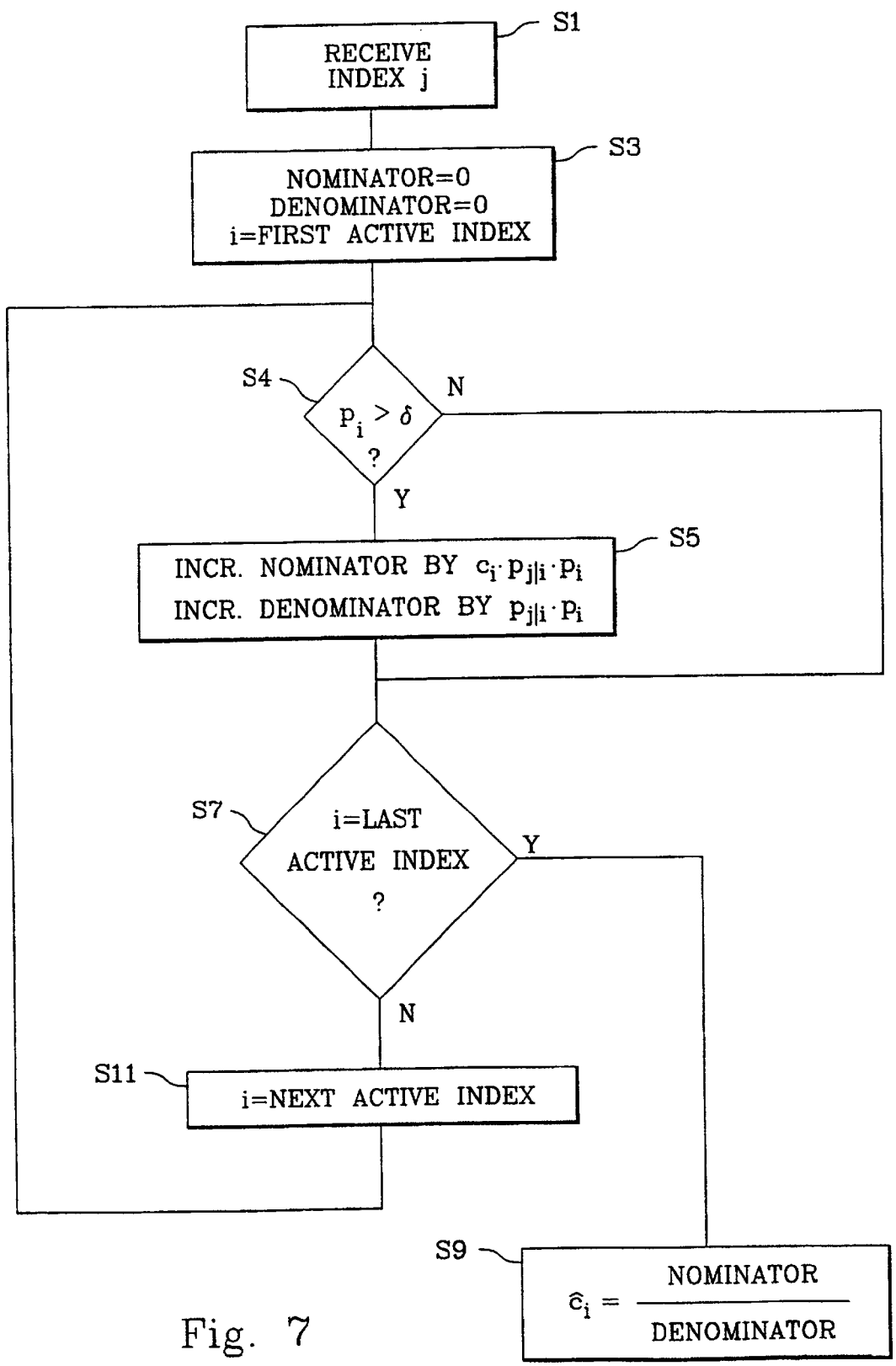
FIG. 7 is a flow chart illustrating an embodiment of a sub-optimal decoding method in accordance with the present invention.

A flow chart illustrating this method is given in FIG. 7. This flow chart differs from the flow chart of FIG. 6 by the added step S4. Step S4 tests whether the source probability exceeds a threshold $\delta$. If it does, this index i is included in the summation. Otherwise this index is excluded from the sums in the numerator and denumerator.

Figure 8:
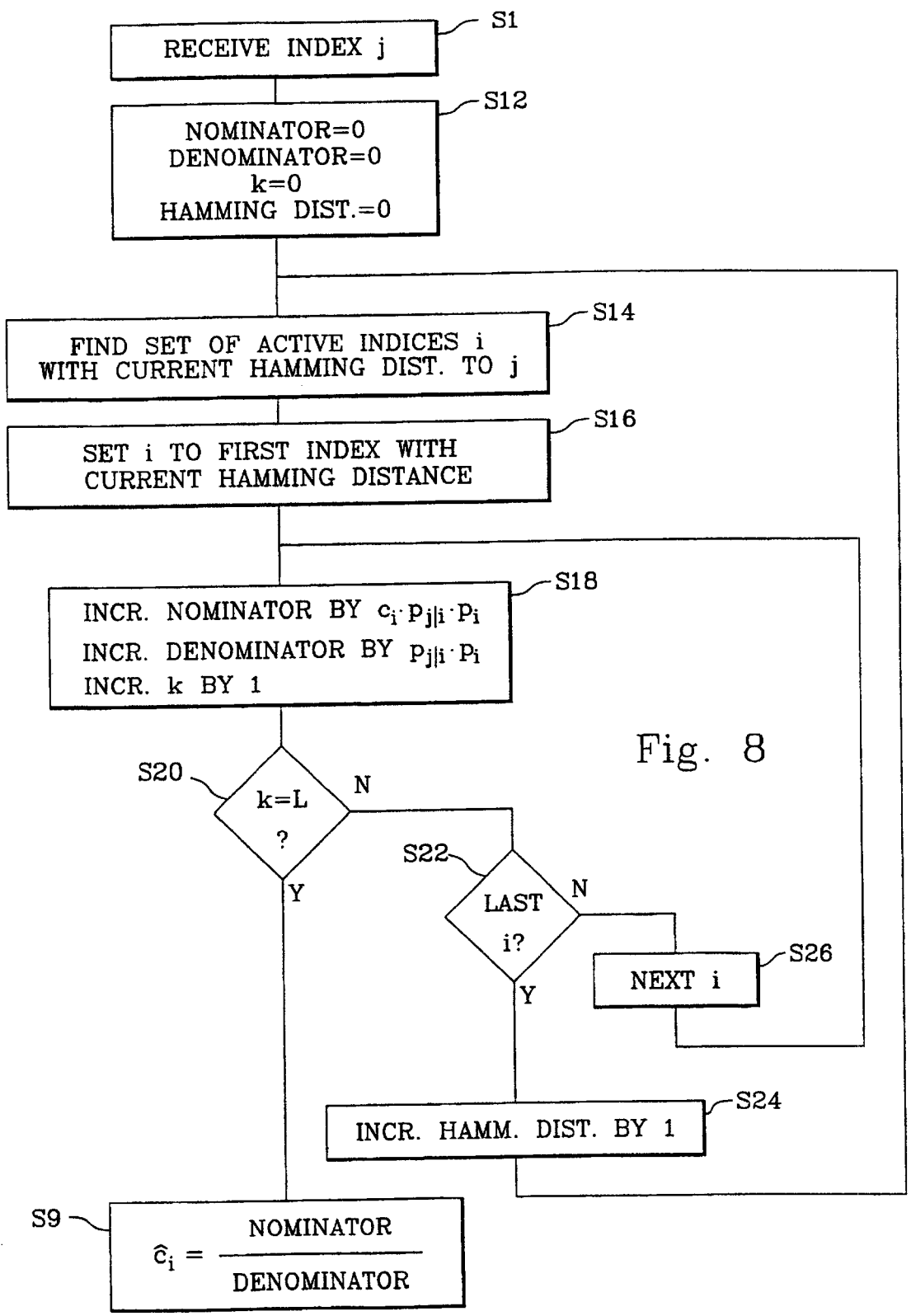
FIG. 8 is a flow chart illustrating another embodiment of a sub-optimal decoding method in accordance with the present invention.

Another sub-optimal approach to calculate an approximation to $\hat{c}_j$ is to sum L terms in descending conditional channel transition probability order. This approach may be summarized as follows:

Receive index j
Set numerator to 0
Set denumerator to 0
Set k (number of terms) to 0
Set current Hamming distance to 0
A. Find all active indices having the current Hamming distance to received index j
   Set i to first active index having the current Hamming distance to j
B. Add $c_i \cdot p_{j|i} \cdot p_i$ to numerator
   Add $p_{j|i} \cdot p_i$ to denumerator
   Increment k by 1
   If k=L (maximum number of terms)
      then go to C.
      else if i is last active index with current Hamming distance to j
         then increment current Hamming distance by 1 and go to A.
         else get next active i with current Hamming distance and go to B.
C. Set $\hat{c}_j$ to numerator/denumerator A flow chart illustrating this method is given in FIG. 8. In step S1 index j is received. Step S12 initializes the numerator, denumerator, the number of accumulated terms, k, and the current Hamming distance to index j. Step S14 finds the set of active indices i having the current Hamming distance to the received index j. Step S16 sets i to the first active index with this Hamming distance. Step S18 increments the numerator, denumerator and the accumulated number of terms, k. Step S20 tests whether all L terms have been accumulated. If this is the case, step S9 is reached, in which the final vector is calculated. If k<L, Step S22 tests whether all active indices having the current Hamming distance to the received index j have been processed. If this is the case, step S24 increments the current Hamming distance by 1, and thereafter the routine returns to step S14 to find the set of active indices that have this Hamming distance to j. Otherwise i is set to the next index in the determined set with the current Hamming distance to j, and the routine returns to step S18 to add the next term to each sum.

Another way of summing a fixed number (L) of terms consists of sorting the $M_a$ active indices i in order of Hamming distance to the received index j. This may be done by performing an XOR operation on the received index j and each active index i and summing the number of 1-bits in the result. These results are stored in a sorted table, The indices i resulting in the fewest 1-bits have the shortest Hamming distances to j and appear first in the table. The active indices i corresponding to the L first entries in this table are then used in the truncated sums of the numerator and denumerator in the estimate of $\hat{c}_j$.

It has been found that very good results may be obtained with very few terms. Thus, experiments have shown that an L in the interval 1–10 gives satisfactory results. In fact L≈5 or higher gives a hardly noticeable distortion relative to the full number ($M_a$≈500) of terms. Even the value L=1 (a single term) results in only a small distortion. This is due to the fact that in most cases the single selected centroid in the decoder (i.e. the nearest Hamming neighbor to received index j), actually is the correct vector, i.e. the same as the centroid corresponding to the transmitted index i. Thus, further terms would only distort the result in these cases.

Since there is a high probability that the received index j is the same as the transmitted index i, or is close to it in Hamming distance, the previous sub-optimal method may be modified by stopping the summations before the limit L is reached. In such a case the summed terms have high channel transition probabilities $p_{j|i}$ (weight) and further terms would only give small contributions the the end result. In this modified embodiment the conditional channel transition probabilities $p_{j|i}$ of summed terms is accumulated, and the summation is stopped if a predetermined probability threshold $p_T$ has been exceeded by the accumulated probability p before L is reached. One advantage of such a modified method lies in the battery savings (in a mobile station) that are obtained by reducing the number of arithmetic operations that have to be performed. This approach may be summarized as follows:

---

Receive index j
    Set numerator to 0
    Set denumerator to 0
    Set k (number of terms) to 0
    Set p (accumulated conditional channel transition probability) to 0
    Set current Hamming distance to 0
A.  Find all active indices having the current Hamming distance to received index j
    Set i to first active index having the current Hamming distance to j
B.  Add $c_i \cdot p_{j|i} \cdot p_i$ to numerator
    Add $p_{j|i} \cdot p_i$ to denumerator
    Increment k by 1
    Increment p by $p_{j|i}$
    If $p > p_T$ (probability threshold) or if k=L
    (maximum number of terms)
        then go to C.
        else if i is last active index with current Hamming distance to j
        then increment current Hamming distance by 1 and go to A.
        else get next active i with current Hamming distance and go to B.
C.  Set $\hat{c}_j$ to numerator/denumerator

---

Figure 9:
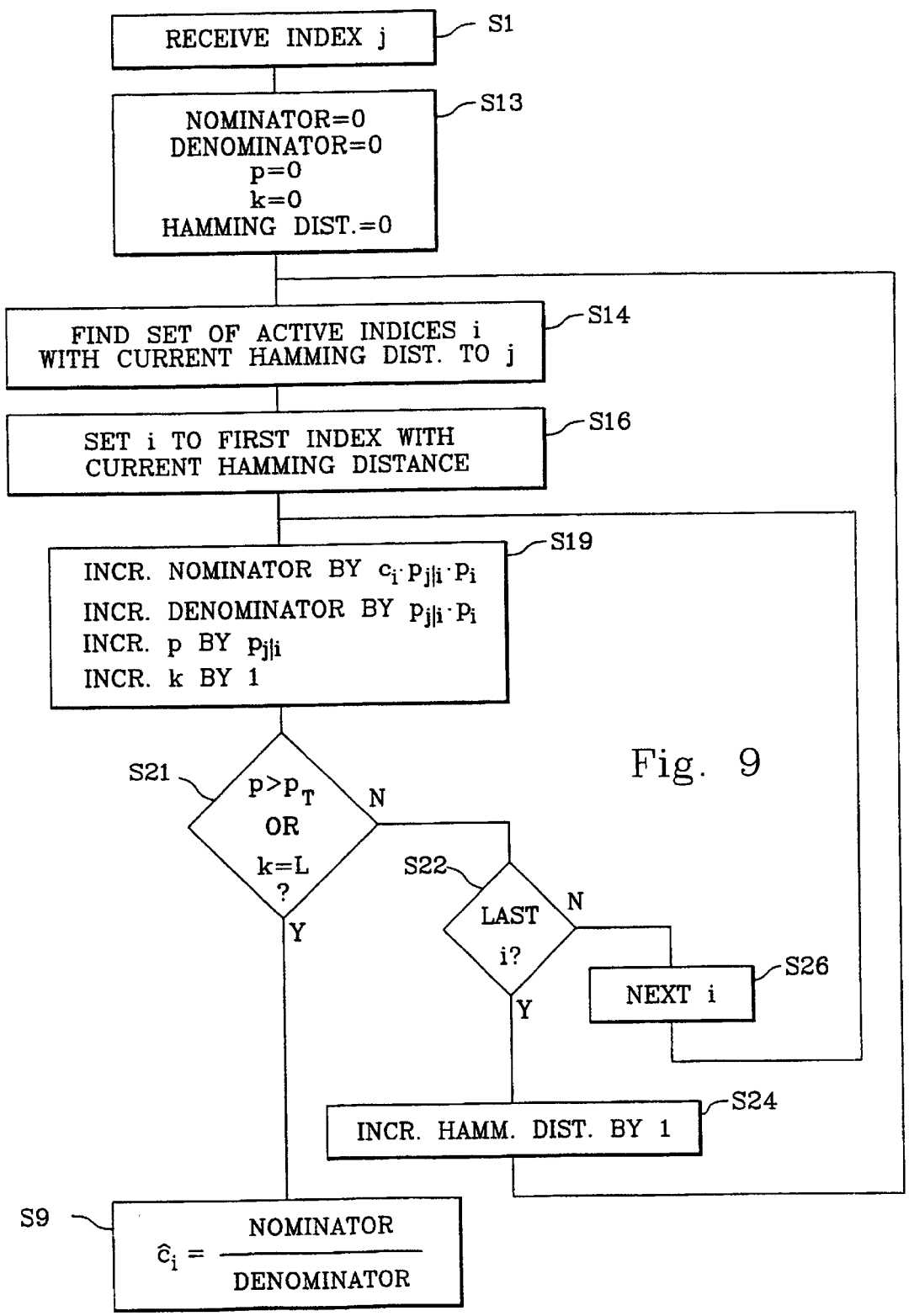
FIG. 9 is a flow chart illustrating a modified embodiment of the sub-optimal decoding method in FIG. 8.

A flow chart illustrating this method is given in FIG. 9. This flow chart differs from the flow chart in FIG. 8 in three ways. The first difference is that step S12 has been replaced by a step S13, in which both an accumulated probability p and a counter k are set to 0.

Furthermore, step S18 has been replaced by a step S19, in which the accumulated probability p is incremented by $p_{j|i}$ and k is incremented by 1. Finally, step S20 has been replaced by a step S21, which tests if the accumulated probability p exceeds the probability threshold $p_T$ or if all L terms have been summed.

Another way to perform this modified method consists of sorting the $M_a$ active indices i in order of Hamming distance to the received index j. This may be done by performing an XOR operation on the received index j and each active index i and summing the number of 1-bits in the result. These results are stored in a sorted table. The indices i resulting in the fewest 1-bits have the shortest Hamming distances to j and appear first in the table. The active indices i corresponding to most significant entries in this table are then used in the truncated sums of the numerator and denumerator in the estimate of $\hat{c}_j$. The sums are truncated when the probability threshold $p_T$ has been exceeded by the accumulated conditional channel transition probabilities $p_{j|i}$ of to the included terms or when L terms have been included.

In the above description of sub-optimal embodiments the conditional channel transition probability $p_{j|i}$ has been used as a goodness measure to determine the most significant terms. However, it is also possible to use other goodness measures, such as $q_{i|j}$, $p_i$, and $|c_i|^2$, or an arithmetic combination thereof. In these cases terms are summed in descending order of these other goodness measures instead.

In the above description the invention has been described with reference to hard decoding, in which the bits of a received index j have been determined to be either 1 or 0. However, the same principles may also be applied to soft decoding, in which the bits of the received index are not quantized to 1 or 0, but retain their actually demodulated floating point values. Soft decoding in general is described in [5].

The main difference between hard and soft decoding is that the conditional channel transition probabilities $p_{j|i}$ are replaced by conditional channel transition probability density functions $f_{R|I}(r|i)$ representing the probability density that a "soft index" r has been received when a "hard" index i has been sent (the possibility of soft decoding has been indicated by the soft index r in parenthesis below the digital channel in FIG. 5).

In soft decoding it is customary to represent an index as a vector, in which each bit position represents one dimension. Furthermore, usually "0" and "1" are represented by +1 and −1, respectively. Thus, if index i is the integer 101001 (in binary representation), a transformation b transforms this index into the vector b(i)=(−41, 1, −1, 1, 1, −1). Similarly, the soft decoded index vector r=($r_1$, $r_2$, . . . , $r_{N-1}$), where each component is a floating point number between −∞ and +∞. With these definitions a suitable probability density function $f_{R|I}(r|i)$ for a binary symmetric channel may be expressed as $$f_{R|I}(r|i) = \frac{1}{\sqrt{2\pi}\,\sigma} e^{-\frac{1}{2\sigma^2}\|r-b(i)\|^2}$$

where $\|.\|^2$ denotes the squared euclidean distance and $\sigma^2$ denotes the noise variance of the channel. The variance $\sigma^2$ is related to the bit error rate $\epsilon$ in accordance with the equation $$\varepsilon = \frac{1}{\sqrt{\pi}} \int_{\frac{1}{\sqrt{2\sigma}}}^{\infty} e^{-z^2}\, dz$$

Thus, the channel quality may be represented by either the bit error rate $\epsilon$ or the noise variance $\sigma^2$, as indicated in block 46 in FIG. 5.

The expression for calculating the decoded vector in vector calculator 42 in FIG. 5 may now be written as $$\hat{c}_r = \frac{\displaystyle\sum_{\substack{only\\active\\indices\\i}} c_i \cdot f_{R|I}(r|i) \cdot p_i}{\displaystyle\sum_{\substack{only\\active\\indices\\i}} f_{R|I}(r|i) \cdot p_i}$$

Note that in this expression $\hat{c}_r$ is, in general, not exactly one of the code book vectors $\hat{c}_j$, since the soft decoded index vector r may not exactly correspond to an index j.

A sub-optimal method in which only terms having $p_i > \sigma$ are retained may be expressed as $$\hat{c}_r \approx \frac{\sum_{\substack{active \\ indices \\ i \text{ for which} \\ p_i > \delta}} c_i \cdot f_{R|I}(r|i) \cdot p_i}{\sum_{\substack{active \\ indices \\ i \text{ for which} \\ p_i > \delta}} f_{R|I}(r|i) \cdot p_i}$$

Similar to the hard decoding case there are also corresponding sub-optional expressions based on sorting terms in descending order of $f_{R|I}(r|i)$ and including only a limited number of terms.

It will be understood by those skilled in the art that various modifications and changes may be made to the present invention without departure from the spirit and scope thereof, which is defined by the appended claims.

REFERENCES

1. Nariman Farvardin, "A Study of Vector Quantization for Noisy Channels", IEEE Transaction on Information Theory, Vol. IT-36, No. 4, pp. 799–809, July 1990.
2. Nariman Farvardin, Vinay Vaishampayan, "On the Performance and Complexity of Channel-Optimized Vector Quantizers", IEEE Transaction on Information Theory, Vol. 37, No. 1, pp. 155–160, January 1991.
3. P. Hedelin, P. Knagenhjelm, M. Skoglund, "Theory for Transmission of Vector Quantization Data", Chapter 10 of "Speech coding and Synthesis", Elsevier Science B.V., 1995.
4. Hong Xiao and Branka Vucetic, "Channel Optimized Vector Quantization with Soft Input Decoding", ISSPA 96, 26–28 August, 1996.
5. Mikael Skoglund, Per Hedelin, "Vector Quantization over a Noisy Channel Using Soft Decision Decoding", Proceedings of IEEE International Conference on Acoustics, Speech and Signal Processing, Vol. 5, pp. 605–608, Adelaide, Australia, April 1994.

What is claimed is:

1. A decoding method in a communication system using channel optimized vector quantization and including an encoder and a decoder, characterized by performing the following steps at said decoder:

storing active encoder centroids $c_i$ corresponding to active indices i, an active index being defined as an index that has a predetermined source probability $p_i > 0$ of being selected by said encoder for transmission to said decoder over a transmission channel;

storing said source probabilities $p_i$;

storing a transmission channel quality measure;

dynamically calculating, from said stored transmission channel quality measure, a set of conditional channel transition probabilities $p_{j|i}$ that an index j has been received by said decoder given that an index i has been sent by said encoder;

calculating an estimate $\hat{c}_j$ of a decoded vector in accordance with the formula:

$$\hat{c}_j = \frac{\sum_{\substack{active \\ indices \\ i}} c_i \cdot p_{j|i} \cdot p_i}{\sum_{\substack{active \\ indices \\ i}} p_{j|i} \cdot p_i}$$

where the summations are restricted to only the most significant terms, and the terms are summed in descending conditional channel transition probability order; and stopping summation at the latest when a predetermined number L, which is less than the number of active indices, of terms have been summed.

2. The method of claim 1, characterized by calculating said estimate $\hat{c}_j$ of a decoded vector in accordance with the formula:

$$\hat{c}_j \approx \frac{\sum_{\substack{active \\ indices \\ i \text{ for which} \\ p_i > \delta}} c_i \cdot p_{j|i} \cdot p_i}{\sum_{\substack{active \\ indices \\ i \text{ for which} \\ p_i > \delta}} p_{j|i} \cdot p_i}$$

where $\delta$ is a predetermined small positive constant.

3. The method of claim 1, characterized by accumulating the conditional channel transition probabilities of summed terms; and stopping summation when a predetermined probability threshold has been exceeded by the accumulated conditional channel transition probabilities before L terms have been summed.

4. The method of any of the preceding claims 1, 2, or 3, characterized by said transmission channel quality measure being the bit error rate $\epsilon$ of said transmission channel.

5. The method of claim 4, characterized by calculating said conditional channel transition probabilities $p_{j|i}$ in accordance with the formula $$p_{j|i} = \epsilon^{d_H(j,i)}(1-\epsilon)^{N-d_H(j,i)}$$

where

N denotes the number of bit positions in an index, and $d_H(j,i)$ denotes the Hamming distance between j and i.

6. A decoding method in a communication system using channel optimized vector quantization and including an encoder and a decoder, characterized by performing the following steps at said decoder:

storing active encoder centroids $c_i$ corresponding to active indices i, an active index being defined as an index that has a predetermined source probability $p_i > 0$ of being selected by said encoder for transmission to said decoder over a transmission channel;

storing said source probabilities $p_i$;

storing a transmission channel quality measure;

dynamically calculating, from said stored transmission channel quality measure a set of conditional channel transition probability density function values $f_{R|I}(r|i)$ representing the probability density that a soft decoded index r has been received by said decoder given that an index i has been sent by said encoder;

calculating an estimate $\hat{c}_j$ of a decoded vector in accordance with the formula:

$$\hat{c}_r = \frac{\sum_{\substack{\text{active} \\ \text{indices} \\ i}} c_i \cdot f_{R|I}(r|i) \cdot p_i}{\sum_{\substack{\text{active} \\ \text{indices} \\ i}} f_{R|I}(r|i) \cdot p_i}$$

where the summations are restricted to only the most significant terms, and the terms are summed in descending conditional channel transition probability density function value order; and stopping summation when a predetermined number L, which is less than the number of active indices, of terms have been summed.

7. The method of claim 6, characterized by calculating said estimate $\hat{c}_r$ of said decoded vector in accordance with the formula:

$$\hat{c}_r \approx \frac{\sum_{\substack{\text{active} \\ \text{indices} \\ i \text{ for which} \\ p_i > \delta}} c_i \cdot f_{R|I}(r|i) \cdot p_i}{\sum_{\substack{\text{active} \\ \text{indices} \\ i \text{ for which} \\ p_i > \delta}} f_{R|I}(r|i) \cdot p_i}$$

where δ is a predetermined small positive constant.

8. The method of claim 6, characterized by accumulating the conditional channel transition probability density function values of summed terms; and stopping summation when a predetermined probability threshold has been exceeded by the accumulated conditional channel transition probability density function values before L terms have been summed.

9. The method of any of the preceding claims claim 6, 7, or 8, characterized by said transmission channel quality measure being a noise variance $\sigma^2$ of said transmission channel.

10. The method of claim 9, characterized by calculating said conditional channel transition probability density function values $f_{R|I}(r|i)$ in accordance with the formula $$f_{R|I}(r|i) = \frac{1}{\sqrt{2\pi}\sigma} e^{-\frac{1}{2\sigma^2}\|r-b(i)\|^2}$$

where b(i) represents an index i as a vector in which each binary digit in i corresponds to either +1 or −1; and $\|\cdot\|^2$ denotes squared euclidean distance.

11. A decoding apparatus in a communication system using channel optimized vector quantization and including an encoder and a decoder, characterized by:

means for storing active encoder centroids $c_i$ corresponding to active indices i, an active index being defined as an index that has a predetermined source probability $p_i > 0$ of being selected by said encoder for transmission to said decoder over a transmission channel;

means for storing said source probabilities $p_i$;

means for storing a transmission channel quality measure;

means for dynamically calculating, from said stored transmission channel quality measure, a set of conditional channel transition probabilities $p_{j|i}$ that an index j has been received by said decoder given that an index i has been sent by said encoder;

means for calculating an estimate $\hat{c}_j$ of a decoded vector in accordance with the formula:

$$\hat{c}_j = \frac{\sum_{\substack{\text{active} \\ \text{indices} \\ i}} c_i \cdot p_{j|i} \cdot p_i}{\sum_{\substack{\text{active} \\ \text{indices} \\ i}} p_{j|i} \cdot p_i}$$

where the summations are restricted to only the most significant terms, and the terms are summed in descending conditional channel transition probability order: and means for stopping summation at the latest when a predetermined number L, which is less than the number of active indices, of terms have been summed.

12. The apparatus of claim 11, characterized by means for calculating said estimate $\hat{c}_j$ of a decoded vector in accordance with the formula:

$$\hat{c}_j \approx \frac{\sum_{\substack{\text{active} \\ \text{indices} \\ i \text{ for which} \\ p_i > \delta}} c_i \cdot p_{j|i} \cdot p_i}{\sum_{\substack{\text{active} \\ \text{indices} \\ i \text{ for which} \\ p_i > \delta}} p_{j|i} \cdot p_i}$$

where δ is a predetermined small positive constant.

13. The apparatus of claim 11, characterized by means for accumulating the conditional channel transition probabilities of summed terms; and means for stopping summation when a predetermined probability threshold has been exceeded by the accumulated conditional channel transition probabilities before L terms have been summed.

14. The apparatus of any of the preceding claims 11, 12, or 13, characterized by means for calculating said conditional channel transition probabilities $p_{j|i}$ in accordance with the formula $$p_{j|i} = \epsilon^{d_H(j,i)}(1-\epsilon)^{N-d_H(j,i)}$$

where

N denotes the number of bit positions in an index, $d_H(j,i)$ denotes the Hamming distance between j and, and ε denotes the bit error rate of said transmission channel.

15. A decoding apparatus in a communication system using channel optimized vector quantization and including an encoder and a decoder, characterized by:

means for storing active encoder centroids $c_i$ corresponding to active indices i, an active index being defined as an index that has a predetermined source probability $p_i > 0$ of being selected by said encoder for transmission to said decoder over a transmission channel;

means for storing said source probabilities $p_i$;

means for storing a transmission channel quality measure;

means for dynamically calculating, from said stored transmission channel quality measure, a set of conditional channel transition probability density function values $f_{R|I}(r|i)$ representing the probability density that a soft decoded index r has been received by said decoder given that an index i has been sent by said encoder;

means for calculating an estimate $\hat{c}_j$ of a decoded vector in accordance with the formula:

$$\hat{c}_r = \frac{\sum\limits_{\substack{\text{active} \\ \text{indices} \\ i}} c_i \cdot f_{R|I}(r \mid i) \cdot p_i}{\sum\limits_{\substack{\text{active} \\ \text{indices} \\ i}} f_{R|I}(r \mid i) \cdot p_i}$$

where the summations are restricted to only the most significant terms, and the terms are summed in descending conditional channel transition probability density function value order; and means for stopping summation when a predetermined number L, which is less than the number of active indices, of terms have been summed.

16. The apparatus of claim 15, characterized by means for calculating said estimate $\hat{c}_r$ of said decoded vector in accordance with the formula:

$$\hat{c}_r \approx \frac{\sum\limits_{\substack{\text{active} \\ \text{indices} \\ i \text{ for which} \\ p_i > \delta}} c_i \cdot f_{R|I}(r \mid i) \cdot p_i}{\sum\limits_{\substack{\text{active} \\ \text{indices} \\ i \text{ for which} \\ p_i > \delta}} f_{R|I}(r \mid i) \cdot p_i}$$

where $\delta$ is a predetermined small positive constant.

17. The apparatus of claim 15, characterized by means for accumulating the conditional channel transition probability density function values of summed terms; and means for stopping summation when a predetermined probability threshold has been exceeded by the accumulated conditional channel transition probability density function values before L terms have been summed.

18. The apparatus of any of the preceding claims 15, 16, or 17, characterized by means for calculating said conditional channel transition probability density function values $f_{R|I}(r|i)$ in accordance with the formula $$f_{R|I}(r \mid i) = \frac{1}{\sqrt{2\pi}\sigma} e^{-\frac{1}{2\sigma^2}\|r - b(i)\|^2}$$

where b(i) represents an index i as a vector in which each binary digit in i corresponds to either +1 or −1, $\|\cdot\|^2$ denotes squared euclidean distance, and $\sigma^2$ denotes a noise variance of said transmission channel.

19. A mobile station in a communication system using channel optimized vector quantization, characterized by a decoder including:

means for storing active encoder centroids $c_i$ corresponding to active indices i, an active index being defined as an index that has a predetermined source probability $p_i > 0$ of being selected by an encoder for transmission to said decoder over a transmission channel;

means for storing said source probabilities $p_i$;

means for storing a transmission channel quality measure;

means for dynamically calculating, from said stored transmission channel quality measure, a set of conditional channel transition probabilities $p_{j|i}$ that an index j has been received by said decoder given that an index i has been sent by said encoder, means for calculating an estimate $\hat{c}_j$ of a decoded vector in accordance with the formula:

$$\hat{c}_j = \frac{\sum\limits_{\substack{\text{active} \\ \text{indices} \\ i}} c_i \cdot p_{j|i} \cdot p_i}{\sum\limits_{\substack{\text{active} \\ \text{indices} \\ i}} p_{j|i} \cdot p_i}$$

where the summations are restricted to only the most significant terms, and the terms are summed in descending conditional channel transition probability order; and means for stopping summation when a predetermined number L, which is less than the number of active indices, of terms have been summed.

20. A mobile station in a communication system using channel optimized vector quantization, characterized by a decoder including:

means for storing active encoder centroids $c_i$ corresponding to active indices i, an active index being defined as an index that has a predetermined source probability $p_i > 0$ of being selected by an encoder for transmission to said decoder over a transmission channel;

means for storing said source probabilities $p_i$;

means for storing a transmission channel quality measure;

means for dynamically calculating, from said stored transmission channel quality measure, a set of conditional channel transition probability density function values $f_{R|I}(r|i)$ representing the probability density that a soft decoded index r has been received by said decoder given that an index i has been sent by said encoder;

means for calculating an estimate $\hat{c}_j$ of a decoded vector in accordance with the formula:

$$\hat{c}_r = \frac{\sum\limits_{\substack{\text{active} \\ \text{indices} \\ i}} c_i \cdot f_{R|I}(r \mid i) \cdot p_i}{\sum\limits_{\substack{\text{active} \\ \text{indices} \\ i}} f_{R|I}(r \mid i) \cdot p_i}$$

where the summations are restricted to only the most significant terms, and the terms are summed in descending conditional channel transition probability density function value order; and means for stopping summation when a predetermined number L, which is less than the number of active indices, of terms have been summed.

21. A base station in a communication system using channel optimized vector quantization, characterized by a decoder including:

means for storing active encoder centroids $c_i$ corresponding to active indices i, an active index being defined as an index that has a predetermined source probability $p_i > 0$ of being selected by an encoder for transmission to said decoder over a transmission channel;

means for storing said source probabilities $p_i$;

means for storing a transmission channel quality measure;

means for dynamically calculating, from said stored transmission channel quality measure, a set of conditional channel transition probabilities $p_{j|i}$ that an index j has been received by said decoder given that an index i has been sent by said encoder;

means for calculating an estimate $\hat{c}_j$ of a decoded vector in accordance with the formula:

$$\hat{c}_j = \frac{\sum\limits_{\substack{active \\ indices \\ i}} c_i \cdot p_{j|i} \cdot p_i}{\sum\limits_{\substack{active \\ indices \\ i}} p_{j|i} \cdot p_i}$$

where the summations are restricted to only the most significant terms, and the terms are summed in descending conditional channel transition probability order; and means for stopping summation when a predetermined number L, which is less than the number of active indices, of terms have been summed.

22. A base station in a communication system using channel optimized vector quantization, characterized by a decoder including:

means for storing active encoder centroids $c_i$ corresponding to active indices i, an active index being defined as an index that has a predetermined source probability $p_i > 0$ of being selected by an encoder for transmission to said decoder over a transmission channel;

means for storing said source probabilities $p_i$;

means for storing a transmission channel quality measures means for dynamically calculating, from said stored transmission channel quality measure, a set of conditional channel transition probability density function values $f_{R|I}(r|i)$ representing the probability density that a soft decoded index r has been received by said decoder given that an index i has been sent by said encoder:

means for calculating an estimate $\hat{c}_j$ of a decoded vector in accordance with the formula:

$$\hat{c}_r = \frac{\sum\limits_{\substack{active \\ indices \\ i}} c_i \cdot f_{R|I}(r|i) \cdot p_i}{\sum\limits_{\substack{active \\ indices \\ i}} f_{R|I}(r|i) \cdot p_i}$$

where the summations are restricted to only the most significant terms, and the terms are summed in descending conditional channel transition probability density function value order; and means for stopping summation when a predetermined number L, which is less than the number of active indices, of terms have been summed.

* * * * *